(12) United States Patent
Stathakis et al.

(10) Patent No.: US 10,749,304 B1
(45) Date of Patent: Aug. 18, 2020

(54) PORT FOR HEAT SINK ONO ACTIVE CABLE END

(71) Applicant: International Business Machines Corporation, Armonk, NY (US)

(72) Inventors: Karl Stathakis, Rochester, MN (US);
Phillip V. Mann, Rochester, MN (US);
John Ryan Harris, Houston, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/533,282

(22) Filed: Aug. 6, 2019

(51) Int. Cl.
| | |
|---|---|
| *H01R 13/00* | (2006.01) |
| *H01R 35/04* | (2006.01) |
| *H01R 12/71* | (2011.01) |
| *H01R 12/70* | (2011.01) |
| *H01R 12/75* | (2011.01) |
| *H05K 1/18* | (2006.01) |
| *H01R 13/52* | (2006.01) |

(52) U.S. Cl.
CPC ......... *H01R 35/04* (2013.01); *H01R 12/7005* (2013.01); *H01R 12/716* (2013.01); *H01R 12/75* (2013.01); *H01R 13/5205* (2013.01); *H05K 1/181* (2013.01); *H05K 2201/10189* (2013.01)

(58) Field of Classification Search
CPC .. H01R 12/75; H01R 12/716; H01R 12/7005; H01R 13/5205; H01R 35/04; H05K 1/181; H05K 2201/10189
USPC ...................................... 439/478, 61, 21, 78
See application file for complete search history.

(56) References Cited

U.S. PATENT DOCUMENTS

| | | | | | |
|---|---|---|---|---|---|
| 3,284,672 | A | * | 11/1966 | Munn ..................... | H01R 23/68 361/730 |
| 4,376,250 | A | * | 3/1983 | Baker, Jr. .............. | H02M 7/003 307/150 |
| 5,398,161 | A | * | 3/1995 | Roy ..................... | H05K 7/20545 361/679.01 |
| 5,764,479 | A | * | 6/1998 | Crump ............... | G06K 13/0825 361/679.6 |
| 5,878,271 | A | * | 3/1999 | Crump ..................... | G06F 1/18 361/679.32 |
| 5,912,801 | A | * | 6/1999 | Roy ..................... | H05K 7/1418 312/223.1 |
| 6,162,073 | A | | 12/2000 | Haq | |

(Continued)

FOREIGN PATENT DOCUMENTS

WO 20040533972 A2 6/2004

OTHER PUBLICATIONS

List of IBM Patents or Patent Applications Treated as Related, dated Aug. 4, 2019, 2 pages.

(Continued)

*Primary Examiner* — Abdullah A Riyami
*Assistant Examiner* — Vladimir Imas
(74) *Attorney, Agent, or Firm* — Grant M. McNeilly

(57) ABSTRACT

An electronic interconnect includes a board, a rotatable connector, and a heat sink. The board extends along a plane, and the rotatable connector is connected to the board. The rotatable connector is configured to allow rotation about an axis parallel to the plane, between a first position and a second position. The heat sink is connected to the rotatable connector and extends a first distance from the board in the first position and a second, greater distance from the board in the second position.

20 Claims, 5 Drawing Sheets

(56) References Cited

U.S. PATENT DOCUMENTS

| | | | |
|---|---|---|---|
| 6,171,120 B1 | 1/2001 | Bolich | |
| 6,465,746 B1 * | 10/2002 | Kajita | H03B 1/02 |
| | | | 174/260 |
| 6,475,021 B1 | 11/2002 | Tan | |
| 6,532,158 B1 * | 3/2003 | Buttet | G06K 7/0008 |
| | | | 361/735 |
| 6,600,647 B1 * | 7/2003 | Girvin | G06F 1/184 |
| | | | 248/636 |
| 6,715,023 B1 | 3/2004 | Abu-Lebdeh | |
| 6,856,747 B2 | 2/2005 | Cloud | |
| 6,890,188 B1 | 5/2005 | Le | |
| 6,911,836 B2 * | 6/2005 | Cannon | G01R 31/2891 |
| | | | 324/750.08 |
| 7,099,152 B2 * | 8/2006 | Gasbarro | G06F 1/1632 |
| | | | 312/223.3 |
| 7,242,576 B2 * | 7/2007 | Coster | G06F 1/181 |
| | | | 292/302 |
| 7,249,992 B2 | 7/2007 | Kalenian | |
| 7,256,992 B1 * | 8/2007 | Stewart | G06F 1/20 |
| | | | 165/80.3 |
| 7,313,000 B2 * | 12/2007 | Fiorentino | G06F 1/189 |
| | | | 361/752 |
| 7,397,674 B2 | 7/2008 | Schlack | |
| 7,452,239 B2 | 11/2008 | Montena | |
| 7,525,810 B2 * | 4/2009 | Jiang | H01R 13/74 |
| | | | 361/752 |
| 7,564,696 B1 | 7/2009 | Winick | |
| 7,635,046 B2 * | 12/2009 | Tominaga | B62D 5/0406 |
| | | | 180/444 |
| 7,679,933 B2 | 3/2010 | Makabe | |
| 7,813,143 B2 * | 10/2010 | Dorenkamp | G02B 6/4452 |
| | | | 174/520 |
| 7,940,532 B2 * | 5/2011 | Willing | H02M 7/003 |
| | | | 174/520 |
| 8,070,504 B2 | 12/2011 | Amidon | |
| 8,169,789 B1 * | 5/2012 | Tong | H01L 23/433 |
| | | | 257/712 |
| 8,416,572 B2 * | 4/2013 | Olsen | G06F 1/20 |
| | | | 165/104.33 |
| 8,911,244 B2 | 12/2014 | Elison | |
| 9,072,195 B2 * | 6/2015 | Kameno | H05K 7/20563 |
| 9,681,572 B2 * | 6/2017 | Artman | G06F 1/18 |
| 9,893,474 B1 * | 2/2018 | Jandt | H01R 13/665 |
| 10,098,262 B2 * | 10/2018 | Ross | H05K 7/20718 |
| 10,201,112 B1 * | 2/2019 | Ju | H01R 12/724 |
| 2006/0114652 A1 | 6/2006 | Jory | |
| 2009/0009964 A1 | 1/2009 | Suzuki | |
| 2013/0238817 A1 | 9/2013 | Klein | |
| 2017/0269314 A1 | 9/2017 | Gaal | |
| 2017/0294823 A1 | 10/2017 | Akiyoshi | |

OTHER PUBLICATIONS

Staats Jr., "Active Heat Transfer Enhancement in Integrated Fan Heat Sinks," Department of Mechanical Engineering, Massachusetts Institute of Technology, Sep. 2012, 211 pages.

Stathakis et al., "Port for Heat Sink on Active Cable End," U.S. Appl. No. 16/533,407, filed Aug. 6, 2019.

* cited by examiner

PORT FOR HEAT SINK ONO ACTIVE CABLE END

BACKGROUND

The present invention relates to computer hardware, and more specifically, to a port that accommodates a heat sink.

Conventional peripheral component interconnects (PCIs) are common structures used for attaching hardware devices in a computer, such as a server. A PCI chassis typically has several parallel connectors attached to a backplane into which PCI cards are connected. There is a bay associated with each connector where the bulk of the PCI card will reside. To conserve space, each bay is directly adjacent to at least one other bay, which limits the width of the PCI cards.

Some PCI cards can include a connector for connecting a cable that originates outside of the PCI chassis. In some instances, such a cable can be an active cable. Because an active cable can have an electronic circuit in the header of the cable, active cables can have heat sinks that must be accommodated by the PCI card and the PCI chassis.

SUMMARY

According to an embodiment of the present disclosure, an electronic interconnect includes a board, a rotatable connector, and a heat sink. The board extends along a plane, and the rotatable connector is connected to the board. The rotatable connector is configured to allow rotation about an axis parallel to the plane, between a first position and a second position. The heat sink is connected to the rotatable connector and extends a first distance from the board in the first position and a second, greater distance from the board in the second position.

According to an embodiment of the present disclosure, a peripheral component interconnect card includes a circuit board extending from a front side to a back side, an electrical component mounted to the circuit board, and a bracket mounted to the circuit board that includes a port for a cable to pass through. Also included are a rotatable connector mounted to the circuit board and electrically connected to the electrical component. The rotatable connector is configured to electrically connect to the cable and rotate with the cable along an axis that extends from the front side to the back side of the circuit board from a first position to a second position.

According to an embodiment of the present disclosure, an electrical connection system includes a chassis, a card, and a cable. The chassis includes a front wall, a rear wall, and a cavity divided into card bays. The card is positioned in one of the card bays and is connected to the chassis. The card includes an electrical component, a bracket mounted to the chassis including a port, and a rotatable connector electrically connected to the electrical component. The cable includes a cord, an electronic circuit, a heat sink, and a cable connector configured to connect to the rotatable connector, wherein the rotatable connector can rotate with rotation of the cable, when the cable is connected to the rotatable connector, between a first position and a second position.

DETAILED DESCRIPTION

Figure 1A:
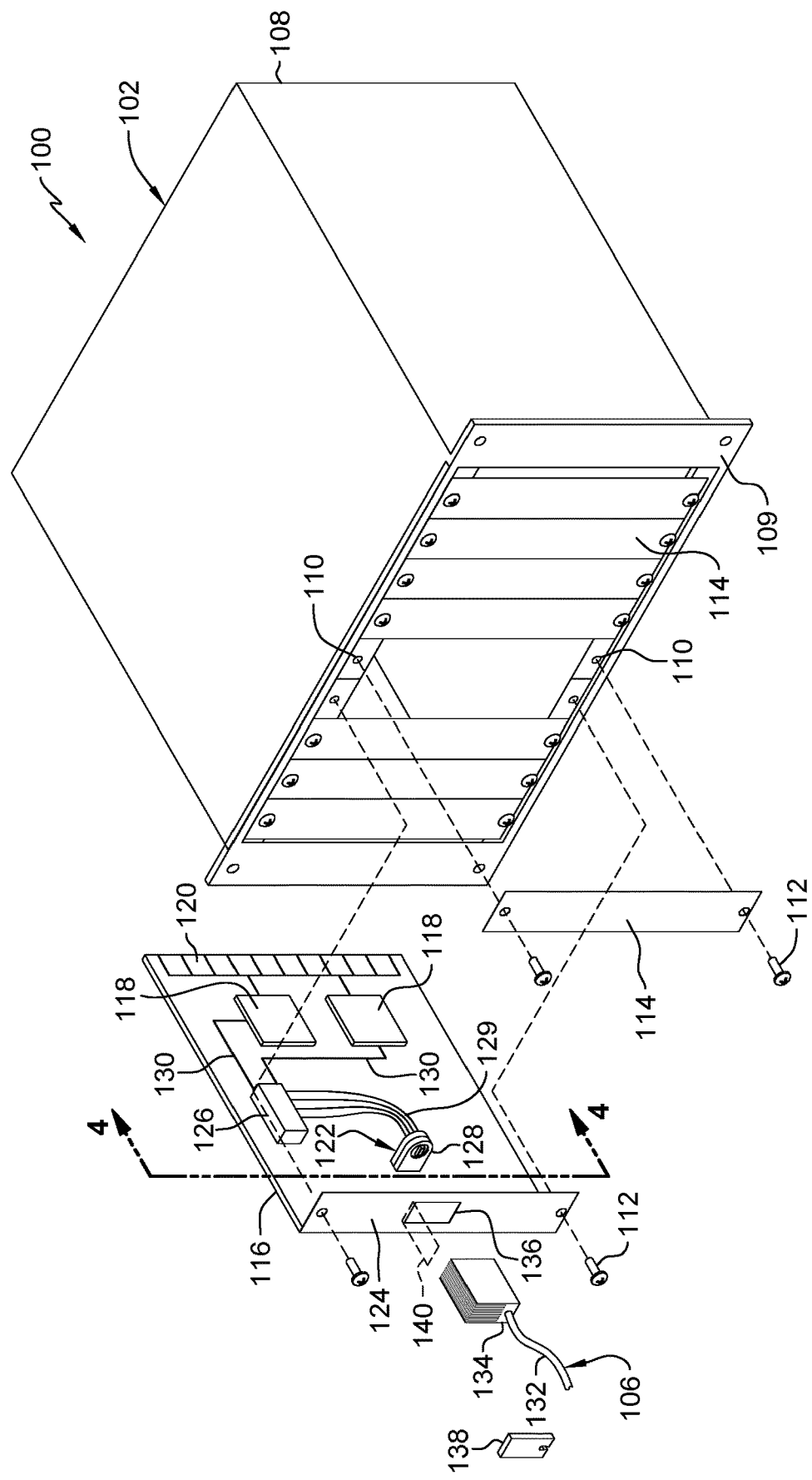
FIG. 1A is an exploded, perspective view of a PCI assembly according to an embodiment of the present disclosure.
Figure 1B:
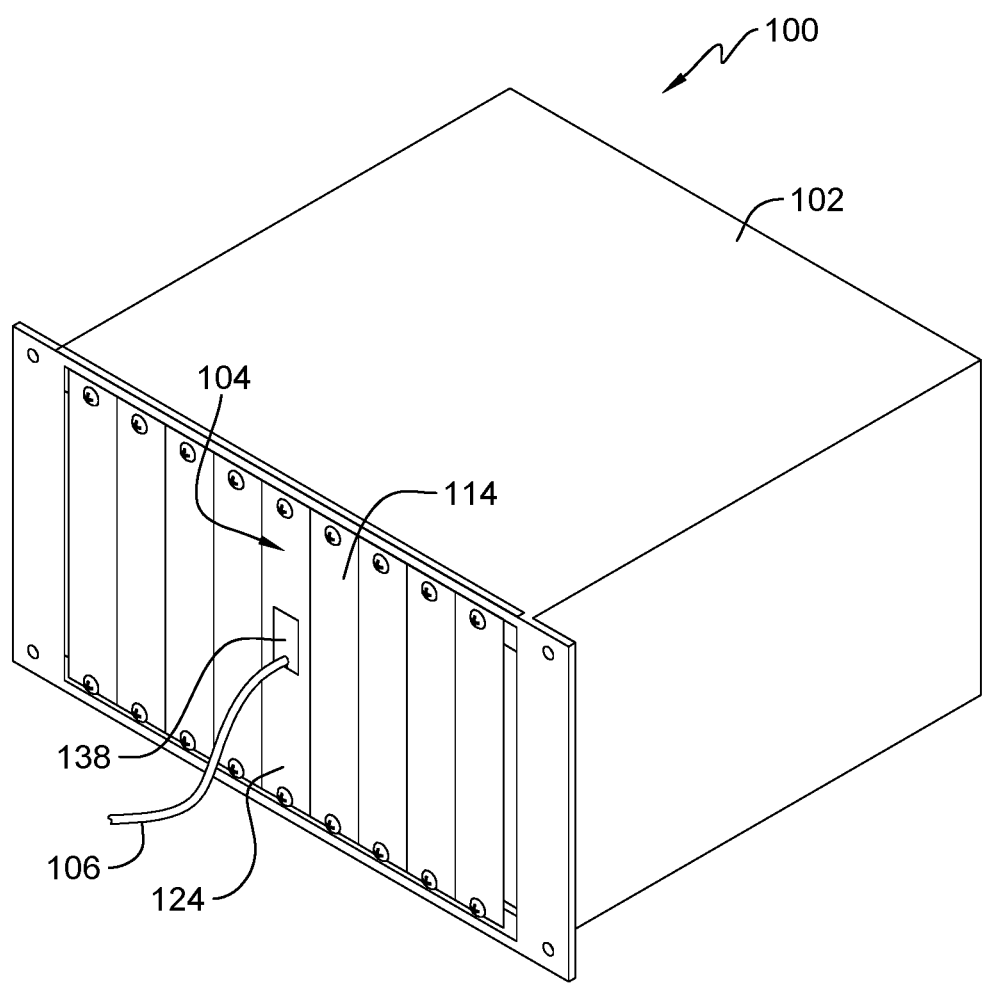
FIG. 1B is a perspective view of the PCI assembly in an assembled configuration.

FIG. 1A is an exploded, perspective view of PCI assembly 100. FIG. 1B is a perspective view of PCI assembly 100 in an assembled configuration. FIGS. 1A and 1B will now be discussed together.

In the illustrated embodiment, PCI assembly 100 includes chassis 102, card 104, and cable 106. Chassis 102 has a large internal cavity with connectors (not shown) arranged in parallel along the inside of rear wall 108. Chassis 102 also has a plurality of threaded mounting holes 110 on front wall 109 for fasteners 112 to secure cover plates 114 and/or PCI cards, such as card 104. Chassis 102 can be divided into bays (shown in FIG. 4) which can be, for example, coincident with the edges of card 104 and cover plates 114, such that FIGS. 1A and 1B show nine bays. In other embodiments, the bays can be spaced apart and/or have additional chassis in between (not shown).

In the illustrated embodiment, card 104 includes circuit board 116 that has electrical components 118, card connector 120, rotatable connector assembly 122, bracket (or tailstock) 124, and board connector 126 mounted thereto. Rotatable connector assembly 122 includes rotatable connector 128 and leads 129 which electrically connect board connector 126 and rotatable connector 128. In addition, conductors 130 extend between board connector 126, electrical components 118, and card connector 120, respectively, to electrically connect those components. In turn, card connector 120 electrically connects card 104 to the backplane (not shown) of chassis 102, which can be connected to a greater computing system, such as a server (not shown).

In the illustrated embodiment, cable 106 includes cord 132 and header 134. Bracket 124 includes a port 136 that has a shape that corresponds with the shape of header 134. For example, if the shape of header 134 is rectangular, then the shape of port 136 would also be a rectangle, although it would be of slightly larger size as to accommodate header 134 as it passes through port 136. Due to the size of header 134, the rectangular shape of port 136 is oriented such that the longer portion extends along bracket 124 and the shorter portion extends across bracket 124. Port 136 is aligned front-to-back with rotatable connector 128, and header 134 is configured to pass through port 136 and connect to rotatable connector 128. After this has occurred, grommet 138 can be fit into port 136 and/or around cord 132 to block electromagnetic interference (EMI) leakage from the interior of chassis 102. Therefore, grommet 138 can be comprised of, for example, an elastomeric, polymer, and/or metal material. In addition to or instead of grommet 138, bracket 124 can include door 140 (shown in phantom in an opened position in FIG. 1A) that is rotatably connected to bracket 124 and can be closed to cover port 136 when cable 106 is not connected to card 104.

The components and configuration of PCI assembly 100 allow for cable 106 to be connected to and disconnected from card 104 while card 104 is connected to chassis 102. In addition, cable 106 can be rotated with respect to card 104 while cable 106 is connected to rotatable connector assembly 122.

FIGS. 1A and 1B show one embodiment of PCI assembly 100, to which there are alternative embodiments. For example, card 104 can have another format other than PCI that still includes bracket 124. While only one card 104 is shown in FIGS. 1A and 1B, more cards 104 (not shown) can be connected to chassis 102. In such an embodiment, the corresponding cover plates 114 would be removed and the cards 104 put in their places.

Figure 2:
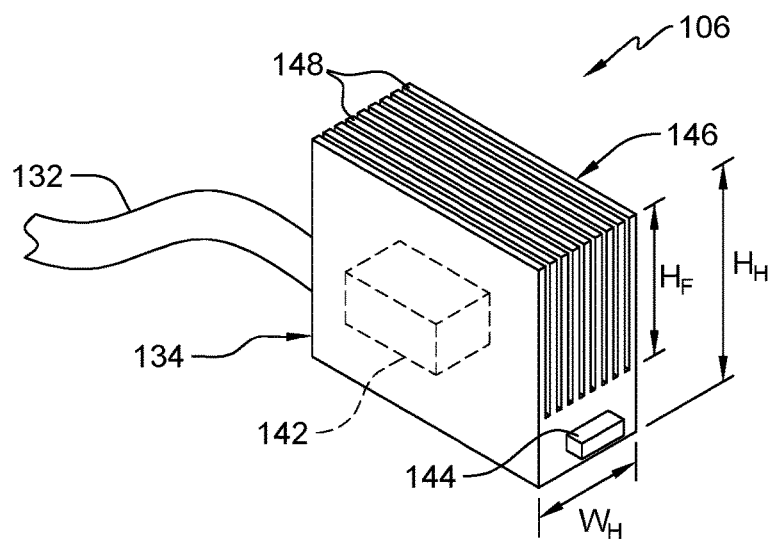
FIG. 2 is a perspective view of an active cable according to an embodiment of the present disclosure.

FIG. 2 is a perspective view of cable 106. Cable 106 is an active cable, so it has electronic circuit 142 in header 134. During operation, electronic circuit 142 can consume, for example 2 W to 5 W of electrical power, so electronic circuit 142 emanates a corresponding amount of heat therefrom. Header 134 also includes plug 144 and heat sink 146 with a plurality of fins 148.

Heat sink 146 can be an integral part of header 134, although in other embodiments, heat sink 146 is permanently affixed to header 134, for example, by brazing. Fins 148 can be, for example, between 5 mm (0.20 in.) and 15 mm (0.59 in.) in height dimension $H_F$. In some such embodiments, for example, fins 148 can be between 5 mm (0.20 in.) to 6 mm (0.24 in.) in height dimension $H_F$, and in other such embodiments, for example, fins 148 can be between 10 mm (0.39 in.) to 15 mm (0.59 in.) in height dimension $H_F$. yes In addition, there can be greater or fewer than nine fins 148. When electronic circuit 142 is operating, heat sink 146 can extract heat from electronic circuit 142 where it can be transferred to the ambient environment. Thereby, electronic circuit 142 can be cooled, for example, by forcing a cooling fluid, such as air, through chassis 102 (shown in FIG. 1A).

Figure 3:
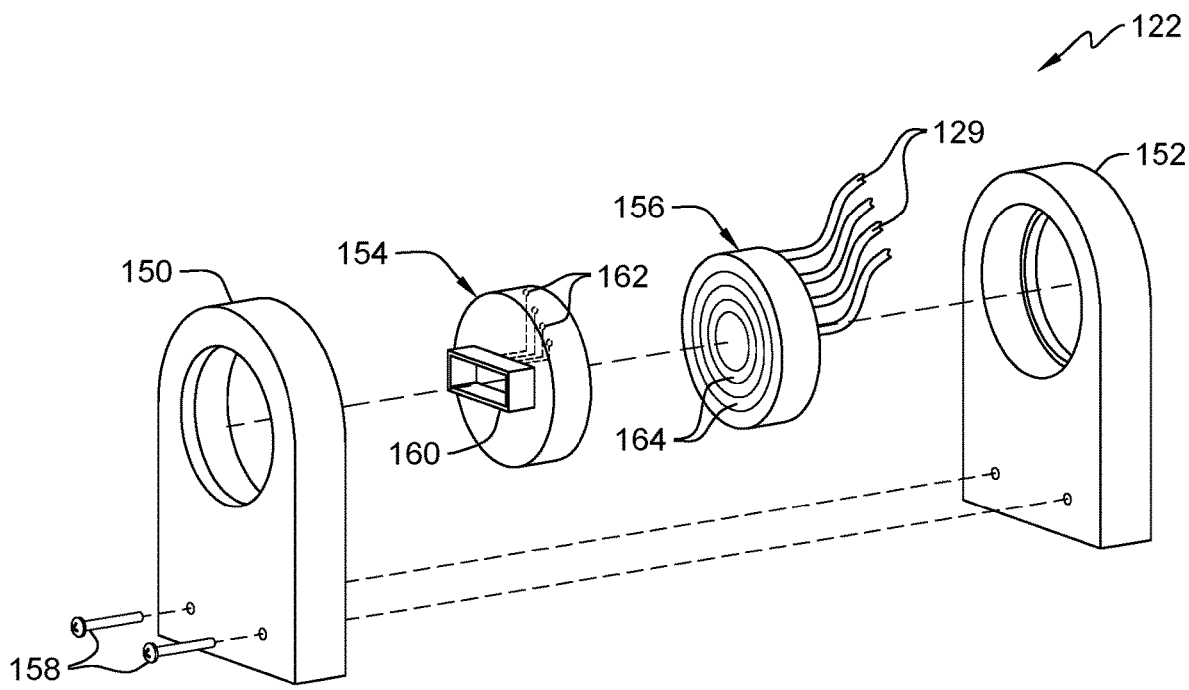
FIG. 3 is an exploded, perspective view of a rotatable electrical connector assembly according to an embodiment of the present disclosure.

FIG. 3 is an exploded, perspective view of rotatable connector assembly 122. In the illustrated embodiment, rotatable connector assembly 122 further includes front housing 150, rear housing 152, receptacle disk 154, and lead disk 156. Receptacle disk 154 has a loose fit in front housing 150 so relative rotation is allowed therebetween, while lead disk 156 has a tight fit in rear housing 152 to prevent relative rotation therebetween. Furthermore, receptacle disk 154 and lead disk 156 are sandwiched in contact with one another when front housing 150 and rear housing 152 are fastened together by fasteners 158. Receptacle disk 154 includes receptacle 160 and contacts 162, wherein each contact 162 corresponds to an electrical pin (not shown) in receptacle 160 and plug 144. Lead disk 156 includes concentric rings 164 that are each electrically insulated from one another and from housings 150 and 152.

In the assembled configuration, receptacle disk 154 can still be rotated despite being in contact with lead disk 156. In addition, each contact 162 is positioned to contact a different one of rings 164, and each ring 164 is connected to only one of leads 129. Therefore, in the illustrated embodiment, four separate electrical connections can be made and maintained between receptacle 160 and leads 129 regardless of the rotational position of receptacle disk 154.

FIG. 3 shows one embodiment of rotatable connector assembly 122, although there can be alternative embodiments. For example, there can be a greater or fewer number of leads 129, contacts 162, and rings 164. For another example, the connectors on card 104 and cable 106 (shown in FIG. 1A) can be switched such that receptacle 160 can be positioned on header 134 (shown in FIG. 2), and plug 144 (shown in FIG. 2) can be positioned on receptacle disk 154. For another example, housings 150 and 152 can be made of nonconductive material such that rings 164 do not need to be insulated from housings 150 and 152.

Figure 4:
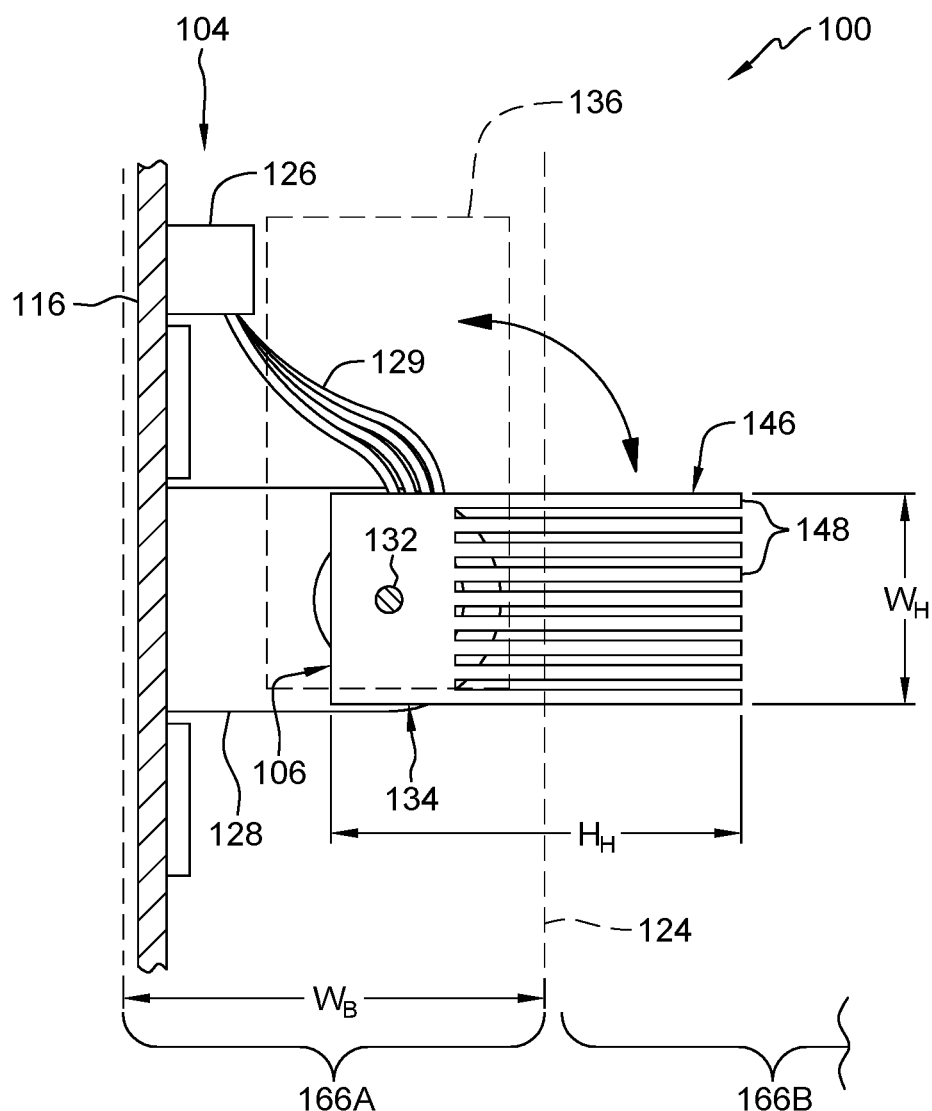
FIG. 4 is a cross-sectional view of the PCI assembly as indicated by line 4-4 in FIG. 1A according to an embodiment of the present disclosure.

FIG. 4 is a cross-sectional view of PCI assembly 100 as indicated by line 4-4 in FIG. 1A. In the illustrated embodiment, card 104 is installed in its own bay 166 in chassis 102 (shown in FIG. 1A), and header 134 is in an installed position with fins 148 extending perpendicularly outward from circuit board 116. This is in contrast with the connecting position, which would be the orientation of header 134 as shown in FIG. 1A (albeit with cable 106 being connected to rotatable connector assembly 122), with fins 148 extending parallel alongside circuit board 116, ninety degrees away from the installed position.

When in the connecting position, header 134 extends a relatively short distance from circuit board 116 so that header 134 can pass through port 136 in bracket 124 (both indicated in phantom). But in the installed position, heat sink 146 extends a relatively long distance from circuit board 116 such that heat sink 146 extends beyond the side edge of bracket 124 and its own bay 166A (because, in the illustrated embodiment, bay 166A is the same size as bracket width dimension $W_B$). Thereby, heat sink 146 extends into the adjacent bay 166B. While this precludes the adjacent bay 166B from having any components in the space swept and occupied by heat sink 146, heat sink 146 can extend farther from circuit board 116 than would be possible with a conventional design that had a cable connecting to a fixed connector on a card. In some embodiments, for example, a height dimension $H_H$ of header 134 can be wider than a width dimension $W_B$ of bracket 124. For another example, a height dimension $H_H$ to width dimension $W_H$ ($H_H/W_H$) ratio of header 134 can be greater than 1.0/1.0, specifically between 1.5/1.0 to 3.0/1.0, as opposed to a conventional design of between 1.0/1.5 to 1.0/1.0. This results in heat sink 146 being exposed to about 340 linear meters per minute (1100 linear feet per minute) of air speed, as opposed to about 150 linear meters per minute (500 linear feet per minute) with a conventional design. Thereby, heat sink 146 is exposed to more air in chassis 102 which increases the efficiency of cooling cable 106 (including electronic circuit 142, shown in FIG. 2).

Figure 5:
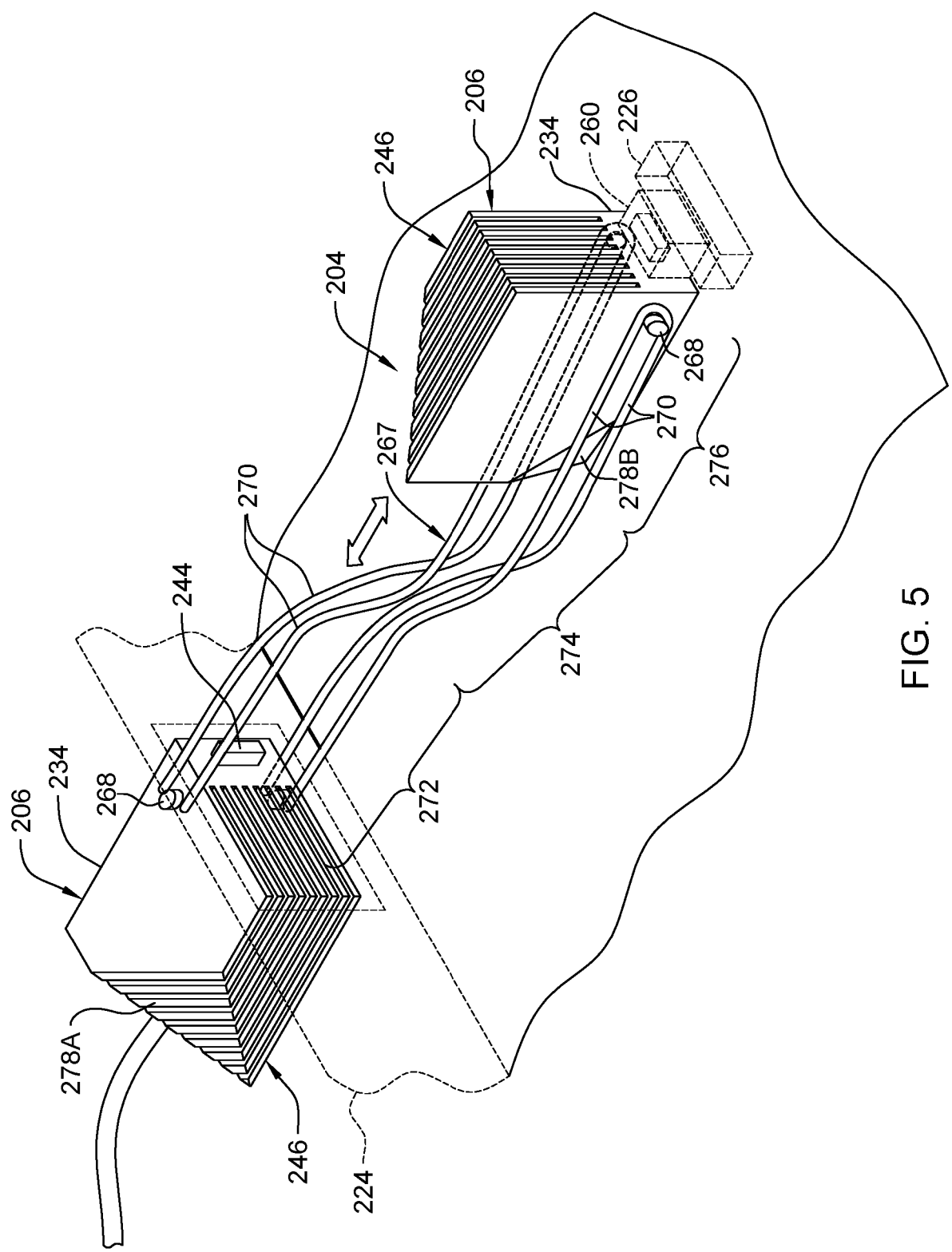
FIG. 5 is a perspective view from the inside of an alternate embodiment PCI assembly according to an embodiment of the present disclosure.

FIG. 5 is a perspective view from the inside of an alternate embodiment PCI assembly 200. Shown in FIG. 5 are card 204 and cord 206 which can be used with a chassis (not shown) that can be similar to chassis 102. Although there may be only one cord 206 used with a given card 204, cord 206 appears twice in FIG. 5 for explanatory purposes (once in an engaged position (top left) and again in a connected position (bottom right)). Card 204 and cord 206 can also be similar to card 104, and cord 106, respectively, albeit with some differences. For example, card 204 does not include a rotary connector assembly, so plug 244 on cord 206 connects with receptacle 260 that is directly on board connector 226.

In such an embodiment, card 204 includes guide 267 and cord 206 includes lugs 268. Guide 267 comprises two pairs of rails 270 that begin slightly in front of bracket 224, with one pair being on one side of port 236 and the other pair being on the opposite side of port 236. The pairs of rails 270 define a helical structure (e.g., a double helix) of pathways that extend towards board connector 226. In the illustrated embodiment, guide 267 (as well as rails 270 and the pathways) is shaped such that guide 267 rotates ninety degrees between bracket 224 and board connector 226.

Lugs 268 are guiding features that are configured to fit into guide 267 and allow for guide 267 to direct the rotation of header 234. Thereby, guide 267 controls the alignment of plug 244 with receptacle 260. In the illustrated embodiment, one lug 268 is positioned on each side of header 234, opposite of each other, with heat sink 246 on the side in between.

Each lug 268 fits between a pair of rails 270. At the entrance to guide 267, lugs 268 engage rails 270 at straight portion 272 of guide 267. At straight portion 272, plug 244 is misaligned ninety degrees from receptacle 260. Adjacent to straight portion 272 is curved portion 274. As header 234 is moved along curved portion 274 of guide 267 towards board connector 226, plug 244 is aligned with receptacle 260. Plug 244 then connects with receptacle 260 as header 234 is moved along another straight portion 276 of guide 267 that is adjacent to curved portion 274. Each pair of rails 270 is joined at the end of straight portion 276 and can limit the inward travel of header 234 such that board connector 226 is not excessively stressed during insertion of plug 244 into receptacle 260. In other embodiments, each pair of rails 270 may be open at the end of straight portion 276 since board connector 226 can limit the inward travel of header 234 and prevent header 234 from going beyond rails 270. In other embodiments, the first straight portion 272 is absent, and guide 267 begins at curved portion 274.

When plug 244 and receptacle 260 are connected, heat sink 246 is positioned wholly within the chassis (i.e., wholly on the board-side of bracket 224). Because header 234 is taller than it is wide and port 236 has a corresponding shape, heat sink 246 is relieved adjacent the cord-side of header 234. More specifically, the cross-section of heat sink 246 is reduced in order to provide clearance from the edges of port 236 as header 234 translates and rotates along guide 267. In the illustrated embodiment, the reduction is in the form of two planar faces 278A and 278B opposite one another instead of pointed corners that would have been present due to the generally rectangular shape that header 234 otherwise has. In some embodiments, the planar faces 278 are the same size, but in other embodiments (such as the illustrated one), planar face 278A on heat sink 246 is significantly larger than planar face 278B. In other embodiments, there is only one planar face 278, for example, planar face 278A.

In other embodiments, the reduction of header 234 is in the form of a curved ribbon surface. In such an embodiment, the reduction can be shaped according to a trigonometric function that depends on the size of port 236, the axis of rotation of guide 267, the rate of twist of guide 267, and where the twisting of guide 267 begins (e.g., the beginning of curved portion 274). While the shape of header 234 would be complex, the size of header 234 would be maximized, which would maximize the heat transfer of heat sink 246.

In other embodiments, guide 267 and lugs 268 can be positioned ninety degrees from where they are shown in FIG. 5, such that one lug 268 would protrude from the heat sink. While a connected header 234 is positioned in the bay that is adjacent to the bay that card 204 is affixed in, in these such embodiments, guide 267 would always be positioned in the adjacent bay. In other embodiments, lugs 268 can have shapes other than that of round pegs. For example, lugs 268 can have a square shape, a T-shape, or an L-shape, and guide 267 would be shaped correspondingly. In some of these alternate embodiments, the orientation of header 234 may be sufficiently controlled using one lug 268, so there may only be one side to guide 267 (as opposed to the two sides formed by the two pairs of rails 270 in FIG. 5). In other embodiments, the guiding features on header 234 (e.g., lugs 268) can be positioned on guide 267. In such an embodiment, header 234 can include slots and/or rails to interface therewith.

The components and configuration of PCI assembly 200 allow for increased cooling due to the increased size of heat sink 246 while employing a simple, stationary board connector 226. Furthermore, guide 267 may be added to some existing cards without requiring full card redesigns.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electric interconnect comprising:
a board extending along a plane;
a rotatable connector connected to the board, the rotatable connector configured to allow rotation about an axis parallel to the plane, between a first position and a second position;
a heat sink connected to the rotatable connector, the heat sink extending a first distance from the board in the first position and extending a second, greater distance from the board in the second position.

2. The electric interconnect of claim 1, wherein the heat sink is connected to a cable comprising an electronic circuit.

3. The electric interconnect of claim 2, wherein the heat sink comprises a plurality of fins that extend in a first direction when the heat sink is in the first position and in a second direction when the heat sink is in the second position.

4. The electric interconnect of claim 3, wherein the first direction is parallel to the plane, and the second direction is perpendicular to the plane.

5. The electric interconnect of claim 2, wherein the rotatable connector comprises:
a rotatable portion configured to connect to a cable connector; and
a stationary portion connected to the board.

6. The electric interconnect of claim 1, wherein the rotatable connector rotates ninety degrees between the first position and the second position.

7. The electric interconnect of claim 1, further comprising:
a bracket connected to the board, the bracket comprising a port aligned with the rotatable connector.

8. The electric interconnect of claim 1, wherein:
the port has a port shape;
the heat sink is connected to a cable comprising an electronic circuit, the cable having a cable shape;
the cable shape corresponds to the port shape when the cable is connected to the rotatable connector and the rotatable connector is in the first position; and
the cable shape does not correspond to the port shape when the cable is connected to the rotatable connector and the rotatable connector is in the second position.

9. A peripheral component interconnect card comprising:
a circuit board extending from a front side to a back side;
an electrical component mounted to the circuit board;
a bracket mounted to the circuit board, the bracket including a port for a cable to pass through; and
a rotatable connector mounted to the circuit board and electrically connected to the electrical component, the rotatable connector being configured to electrically connect to the cable and rotate with the cable along an axis that extends from the front side to the back side of the circuit board from a first position to a second position.

10. The peripheral component interconnect card of claim 9, wherein the cable comprises a heat sink that extends beyond a side edge of the bracket when the rotatable connector is in the second position.

11. The peripheral component interconnect card of claim 10, wherein:
the port has a port shape;
the heat sink has a heat sink shape;
the heat sink shape corresponds to the port shape when the cable is connected to the rotatable connector and the rotatable connector is in the first position; and
the heat sink shape does not correspond to the port shape when the cable is connected to the rotatable connector and the rotatable connector is in the second position.

12. The peripheral component interconnect card of claim 9, wherein the rotatable connector comprises:
a rotatable portion configured to connect to a cable connector; and
a stationary portion connected to the circuit board.

13. The peripheral component interconnect card of claim 9, wherein the rotatable connector rotates ninety degrees with the cable between a connecting position and an installed position.

14. The peripheral component interconnect card of claim 9, further comprising:
a grommet configured to fit in the port and around the cable when the cable is electrically connected to the rotatable connector.

15. The peripheral component interconnect card of claim 9, wherein the port is aligned with the rotatable connector.

16. The peripheral component interconnect card of claim 9, wherein the port has a height-to-width ratio of 1.5/1.0 to 3.0/1.0.

17. An electrical connection system comprising:
a chassis comprising a front wall, a rear wall, and a cavity divided into a plurality of card bays;
a card positioned in one of the plurality of card bays and connected to the chassis, the card comprising:
an electrical component;
a bracket mounted to the chassis, the bracket including a port; and
a rotatable connector electrically connected to the electrical component; and
a cable comprising:
a cord;
an electronic circuit;
a heat sink; and
a cable connector configured to connect to the rotatable connector;
wherein the rotatable connector can rotate with rotation of the cable, when the cable is connected to the rotatable connector, between a first position and a second position.

18. The electrical connection system of claim 17, wherein:
the port has a port shape;
the heat sink has a heat sink shape;
the heat sink shape corresponds to the port shape when the cable is connected to the rotatable connector and the rotatable connector is in the first position; and
the heat sink shape does not correspond to the port shape when the cable is connected to the rotatable connector and the rotatable connector is in the second position.

19. The electrical connection system of claim 17, further comprising:
a grommet configured to fit in the port and around the cable when the cable is connected to the rotatable connector.

20. The electrical connection system of claim 17, wherein the heat sink extends into an adjacent one of the plurality of card bays when the cable is in the second position.

* * * * *